(12) United States Patent
McBride et al.

(10) Patent No.: US 12,080,634 B2
(45) Date of Patent: Sep. 3, 2024

(54) SEMICONDUCTOR DEVICE, PRINTED CIRCUIT BOARD (PCB), AND METHOD OF INTERFACING CONTROL PIN (GATE PIN) OF A POWER SEMICONDUCTOR DEVICE (MOSFET) TO A PRINTED CIRCUIT BOARD (PCB)

(71) Applicant: THE NOCO COMPANY, Glenwillow, OH (US)

(72) Inventors: James P. McBride, Phoenix, AZ (US); James Richard Stanfield, Glendale, AZ (US)

(73) Assignee: The Noco Company, Glenwillow, OH (US)

( * ) Notice: Subject to any disclaimer, the term of this patent is extended or adjusted under 35 U.S.C. 154(b) by 292 days.

(21) Appl. No.: 17/756,556

(22) PCT Filed: Nov. 25, 2020

(86) PCT No.: PCT/US2020/062417
§ 371 (c)(1),
(2) Date: May 26, 2022

(87) PCT Pub. No.: WO2021/108706
PCT Pub. Date: Jun. 3, 2021

(65) Prior Publication Data
US 2022/0399256 A1    Dec. 15, 2022

Related U.S. Application Data

(63) Continuation-in-part of application No. 29/715,103, filed on Nov. 27, 2019, now Pat. No. Des. 920,264,
(Continued)

(51) Int. Cl.
*H05K 1/18*   (2006.01)
*H01L 23/495*   (2006.01)
(Continued)

(52) U.S. Cl.
CPC .. *H01L 23/49555* (2013.01); *H01L 23/49562* (2013.01); *H01M 10/4257* (2013.01);
(Continued)

(58) Field of Classification Search
CPC ............. H05K 1/18; H05K 1/181–187; H05K 3/3405; H05K 3/341; H01L 23/495; H01L 23/4951; H01L 23/4952; H01L 23/49555
(Continued)

(56) References Cited

U.S. PATENT DOCUMENTS 3,846,823 A    11/1974    Matthews et al.
5,198,964 A *   3/1993    Ito ...................... H01L 23/4334
                                                           257/796
(Continued)

FOREIGN PATENT DOCUMENTS

WO    WO 2018/211935    11/2018

OTHER PUBLICATIONS

UK Intellectual Property Office, Appl. GB2207806.7, Examination Report, Mar. 15, 2024.
(Continued)

*Primary Examiner* — Tuan T Dinh
(74) *Attorney, Agent, or Firm* — Jones Day

(57) ABSTRACT

Provided is a MOSFET device for use with a printed circuit board (PCB) of a battery management system (BMS), the device including a semiconductor body; a metal conductor extending outwardly from a side of the semiconductor body; a plurality of power pins extending outwardly from at least one side of the semiconductor body, the power pins having tips bent downwardly; a gate pin extending outwardly from at least one side of the semiconductor body, wherein the tip of the gate pin is raised or elevated relative to the tips of the power pins so as to avoid electrical contact with the one of
(Continued)

the spaced apart copper plates, and wherein the tip of the gate pin is connected to a circuit of the battery management system (BMS).

11 Claims, 3 Drawing Sheets

Related U.S. Application Data and a continuation-in-part of application No. 29/715,105, filed on Nov. 27, 2019, now Pat. No. Des. 932,452.

(60) Provisional application No. 62/941,275, filed on Nov. 27, 2019.

(51) Int. Cl.
*H01M 10/42* (2006.01)
*H01M 50/519* (2021.01)
*H05K 1/14* (2006.01)
*H05K 3/34* (2006.01)
*H01L 25/11* (2006.01)

(52) U.S. Cl.
CPC .......... *H01M 50/519* (2021.01); *H05K 1/141* (2013.01); *H05K 1/181* (2013.01); *H05K 3/3426* (2013.01); *H01L 25/115* (2013.01); *H01M 2010/4271* (2013.01); *H05K 2201/10166* (2013.01); *H05K 2201/10522* (2013.01); *H05K 2201/10628* (2013.01); *H05K 2201/10659* (2013.01); *H05K 2201/10757* (2013.01); *H05K 2201/10818* (2013.01); *H05K 2203/049* (2013.01)

(58) Field of Classification Search
USPC .................. 361/790–784, 813, 772–774; 257/691–697, 666
See application file for complete search history.

(56) References Cited

U.S. PATENT DOCUMENTS

| | | | |
|---|---|---|---|
| 5,492,842 A * | 2/1996 | Eytcheson | H02M 7/003 |
| | | | 438/15 |
| 7,540,788 B2 | 6/2009 | Murphy et al. | |
| 7,812,464 B2 | 10/2010 | Hirashima et al. | |
| 9,440,601 B2 | 9/2016 | Soleski et al. | |
| 9,978,672 B1 * | 5/2018 | Ahlers | H02M 7/53871 |
| 2006/0263988 A1 * | 11/2006 | Takahashi | H01L 29/7813 |
| | | | 257/E27.06 |
| 2007/0158819 A1 * | 7/2007 | Hirashima | H01L 24/81 |
| | | | 257/E23.044 |
| 2007/0215996 A1 * | 9/2007 | Otremba | H01L 23/49524 |
| | | | 257/E23.047 |
| 2011/0108963 A1 | 5/2011 | Balakrishnan et al. | |
| 2014/0354238 A1 | 12/2014 | Moreno et al. | |
| 2016/0093561 A1 * | 3/2016 | Tabira | H01L 24/97 |
| | | | 257/676 |
| 2017/0006703 A1 * | 1/2017 | Haraguchi | H05K 1/18 |
| 2017/0006721 A1 * | 1/2017 | Soyano | H01L 25/07 |
| 2017/0094790 A1 | 3/2017 | Tazarine et al. | |
| 2018/0315684 A1 * | 11/2018 | Sato | H01L 24/05 |
| 2019/0006268 A1 * | 1/2019 | Sugiura | H01L 23/49568 |

OTHER PUBLICATIONS

European Patent Office, Appl. 20894420.7, Extended European Search Report, Dec. 11, 2023.
UK Intellectual Property Office, Appl. GB2207806.7, Examination Report, Nov. 22, 2023.
Canadian Patent Office, Appl. 3,163,239, Examination Report, Aug. 18, 2023.
Japan Patent Office, Appl. 2022-531061, Notification of Reasons for Refusal, Jun. 27, 2023.
Canadian Patent Office, Appl. 3,163,239, Examination Report, Feb. 20, 2024.
Patent Cooperation Treaty, PCT/US2020/062417, International Search Report and Written Opinion, Feb. 17, 2021.
IP Australia, Appl. 2020393921, Examination Report No. 1, Jan. 11, 2023.
IP India, Appl. 202237029312, Examination Report, Feb. 27, 2023.
IP Australia, Appl. 2023204342, Examination Report No. 1, May 28, 2024.
UK Intellectual Property Office, Appl. GB2207806.7, Examination Report, May 23, 2024.

* cited by examiner

SEMICONDUCTOR DEVICE, PRINTED CIRCUIT BOARD (PCB), AND METHOD OF INTERFACING CONTROL PIN (GATE PIN) OF A POWER SEMICONDUCTOR DEVICE (MOSFET) TO A PRINTED CIRCUIT BOARD (PCB)

FIELD

The present invention relates to a semiconductor device (e.g. MOSFET), a printed circuit board (PCB) with a semiconductor device (e.g. MOSFET), and method of interfacing control pin of a power semiconductor device (e.g. MOSFET) to a printed circuit board in a battery management system (BMS) of a lithium ion battery.

BACKGROUND

Lithium ion batteries require a battery management system (BMS) in order to provide protection against various fault conditions. The BMS disconnects the internal battery cells from the external battery terminals when a fault condition occurs. Semiconductor power devices, typically MOSFETs, are used to provide this disconnect function. Since the MOSFETs are in series with the battery cells, they must be able to handle the full battery current passing through the MOSFETS, which can be quite high in some applications.

Since the MOSFETs in a BMS can be required to conduct very high current, designers desire to select MOSFETs with the highest performance. Typically this means MOSFETS with the lowest On Resistance, lowest thermal resistance, and highest maximum drain current ratings. In addition, the MOSFET selected for the application must have an appropriate drain voltage rating for the application. With these requirements, the highest performing MOSFETs available for a given BMS application will often be configured in a surface mount package.

In many cases, the MOSFETs are soldered directly to a printed circuit board (PCB). MOSFETs in surface mount packages are appropriate for this case. However, in some new high current applications, it is desired to mount the MOSFETs to electrically conductive plates or bars (e.g. copper plates or bars), which can act as heatsinks in order to decrease heat rise, and increase the maximum current that can be conducted through the MOSFETs. In this case, the configuration of standard MOSFET surface mount packages is problematic, since the gate pin on each standard MOSFET must be connected to the system controller integrated circuit (IC), and not to a copper plate or bar.

The difficulty with connecting standard MOSFETs in this manner is that the connecting end of the gate pin on each standard MOSFET surface mount package is located in the same plane as the connecting ends of the power pins, as shown in the conventional MOSFET 1 shown in FIG. 1. This makes it difficult to electrically isolate the gate pin 4 from the power pins 3 connected to the copper plate or bar (not shown), and to connect the gate pin 4 to the controller integrated circuit (IC) (not shown).

Thus, there exists a need to provide a new and improved MOSFET surface mount configuration, and a new and improved method of connecting MOSFETs to a printed circuit board (PCB) having one or more.

Again, the conventional MOSFET 1 is not configured to be installed onto a printed circuit board (PCB) provided or fitted with copper plates or bars, for example, for use in a battery management system (BMS) of a lithium ion battery.

SUMMARY

A solution is to isolate the power pin (e.g. gate pin) of the MOSFET from a copper plate or bar installed on the printed circuit board (PCB) using insulating material to insulate the gate pin from the copper plate or bar. For example, a polyamide tape or other insulating materials commonly used in electronics manufacturing could be used for this purpose. However, then soldering a wire to the gate pin is difficult to perform in manufacturing, and prone to failure due to shorts. Therefore, a better method for isolating and connecting to the MOSFET gate pin method is desired.

The present invention is directed to provide a MOSFET having a raised or elevated gate pin. For example, the gate pin of the MOSFET is made to be straight or partially bent during manufacturing of the gate pin and/or during manufacturing of the MOSFET. Alternative, a bent gate pin can be bent straight or partially bent during manufacturing of the gate pin and/or during manufacturing of the MOSFET. For example, the gate pin on a manufactured MOSFET is bent upward to provide physical and electrical isolation from the copper plate or bar of the printed circuit board (PCB), or other conductor that the power pins are attached.

The gate pin is connected to circuit of the battery management system (BMS), for example, connected to an integrated circuit (IC) of the battery management system (BMS). For example, a connecting wire is used to connect the gate pin or lead on the MOSFET which is raised or elevated to a PCB containing the controller electronics. In the case of more than one MOSFET in parallel, each MOSFET may have an individual wire connecting to the PCB, or the individual pins may be wired together in a daisy-chain fashion, and then a single wire is used to connect to the printed circuit board (PCB).

In some cases the battery management system (BMS) must operate in a harsh environment and must withstand severe shock and vibration. In this case, the MOSFET installed on the printed circuit board (PCB) will include a material placed under and around the gate pin on the MOSFET (e.g. between PCB and gate pin) to provide physical stability and resistance to shock and vibration. An example of an appropriate material for this application is RTV (Room Temperature Vulcanizing Silicone). Other materials may also be suitable for this application.

As another example, the printed circuit board (BCB) is provided with another printed circuit board (e.g. gate printed circuit board (PCB)) to connect to the raised or elevated gate lead of the MOSFET, which is raised or elevated relative to the tips of the power pins. In the case where more than one MOSFET is used, the gate printed circuit board (PCB) interfaces to each MOSFET.

The gate printed circuit board (PCB) is connected to the main PCB containing the battery management system (BMS) controller using a wire. Other standard electrical connection methods such as electrical connectors can be used to make the connection.

There will be one or more connection points between the gate printed circuit board (PCB) and the main printed circuit board (PCB) depending on if the MOSFET gates can be connected together or must remain separate.

The gate printed circuit board (PCB) may contain electrical components that interface to the MOSFET gate.

The gate printed circuit board (PCB) provides mechanical stability to the connections. However, if the operating environment for the BMS is harsh, RTV or similar material can be added, as described in the invention above, to further stabilize the MOSFET gates against shock and vibration.

The presently described subject matter is directed to a MOSFET device for use with a printed circuit board (PCB) of a battery management system (BMS), the device comprising or consisting of: a semiconductor body; a metal conductor extending outwardly from a side of the semiconductor body; a plurality of power pins extending outwardly from at least one side of the semiconductor body, the power pins having tips bent downwardly; a gate pin extending outwardly from at least one side of the semiconductor body, wherein the tip of the gate pin is raised or elevated relative to the tips of the power pins so as to avoid electrical contact with the one of the spaced apart copper plates, and wherein the tip of the gate pin is connected to a circuit of the battery management system (BMS).

The presently described subject matter is directed to a MOSFET device for use with a printed circuit board (PCB) of a battery management system (BMS), the device comprising or consisting of: a semiconductor body; a metal conductor extending outwardly from a side of the semiconductor body; a plurality of power pins extending outwardly from at least one side of the semiconductor body, the power pins having tips bent downwardly; a gate pin extending outwardly from at least one side of the semiconductor body, wherein the tip of the gate pin is raised or elevated relative to the tips of the power pins so as to avoid electrical contact with the one of the spaced apart copper plates, and wherein the tip of the gate pin is connected to a circuit of the battery management system (BMS), wherein the gate pin is a straight gate pin.

The presently described subject matter is directed to a MOSFET device for use with a printed circuit board (PCB) of a battery management system (BMS), the device comprising or consisting of: a semiconductor body; a metal conductor extending outwardly from a side of the semiconductor body; a plurality of power pins extending outwardly from at least one side of the semiconductor body, the power pins having tips bent downwardly; a gate pin extending outwardly from at least one side of the semiconductor body, wherein the tip of the gate pin is raised or elevated relative to the tips of the power pins so as to avoid electrical contact with the one of the spaced apart copper plates, and wherein the tip of the gate pin is connected to a circuit of the battery management system (BMS), wherein the power pins have a fully bent configuration and the gate pin has a partially bent configuration.

The presently described subject matter is directed to a MOSFET device for use with a printed circuit board (PCB) of a battery management system (BMS), the device comprising or consisting of: a semiconductor body; a metal conductor extending outwardly from a side of the semiconductor body; a plurality of power pins extending outwardly from at least one side of the semiconductor body, the power pins having tips bent downwardly; a gate pin extending outwardly from at least one side of the semiconductor body, wherein the tip of the gate pin is raised or elevated relative to the tips of the power pins so as to avoid electrical contact with the one of the spaced apart copper plates, and wherein the tip of the gate pin is connected to a circuit of the battery management system (BMS), wherein a lower surface of the tips of the power pins are located in a same plane as a lower surface of the semiconductor body.

The presently described subject matter is directed to a MOSFET device for use with a printed circuit board (PCB) of a battery management system (BMS), the device comprising or consisting of: a semiconductor body; a metal conductor extending outwardly from a side of the semiconductor body; a plurality of power pins extending outwardly from at least one side of the semiconductor body, the power pins having tips bent downwardly; a gate pin extending outwardly from at least one side of the semiconductor body, wherein the tip of the gate pin is raised or elevated relative to the tips of the power pins so as to avoid electrical contact with the one of the spaced apart copper plates, and wherein the tip of the gate pin is connected to a circuit of the battery management system (BMS), wherein the gate pin is connected to a trace of the printed circuit board (PCB) for connecting the gate pin to a circuit of the battery management system (BMS).

The presently described subject matter is directed to a MOSFET device for use with a printed circuit board (PCB) of a battery management system (BMS), the device comprising or consisting of: a semiconductor body; a metal conductor extending outwardly from a side of the semiconductor body; a plurality of power pins extending outwardly from at least one side of the semiconductor body, the power pins having tips bent downwardly; a gate pin extending outwardly from at least one side of the semiconductor body, wherein the tip of the gate pin is raised or elevated relative to the tips of the power pins so as to avoid electrical contact with the one of the spaced apart copper plates, and wherein the tip of the gate pin is connected to a circuit of the battery management system (BMS), wherein the gate pin is connected to a trace of the printed circuit board (PCB) for connecting the gate pin to a circuit of the battery management system (BMS), wherein the gate pin is connected to the trace of the printed circuit board by a connector wire.

The presently described subject matter is directed to a MOSFET device for use with a printed circuit board (PCB) of a battery management system (BMS), the device comprising or consisting of: a semiconductor body; a metal conductor extending outwardly from a side of the semiconductor body; a plurality of power pins extending outwardly from at least one side of the semiconductor body, the power pins having tips bent downwardly; a gate pin extending outwardly from at least one side of the semiconductor body, wherein the tip of the gate pin is raised or elevated relative to the tips of the power pins so as to avoid electrical contact with the one of the spaced apart copper plates, and wherein the tip of the gate pin is connected to a circuit of the battery management system (BMS), wherein the gate pin is connected to a gate printed circuit board connected to the printed circuit board (PCB) for connecting the gate pin to a circuit of the battery management system (BMS).

The presently described subject matter is directed to a printed circuit board (PCB) device for use with a battery management system (BMS) of a lithium ion battery, comprising; a printed circuit board having spaced apart copper plates; and a plurality of MOSFETs bridging the copper plates, the MOSFETs each comprising: a semiconductor body; a plurality of power pins extending outwardly from at least one side of the semiconductor body, the power pins having tips bent downwardly and connected to one of the spaced apart copper plates; a gate pin extending outwardly from at least one side of the semiconductor body, the gate pin connected to a circuit of the battery management system (BMS), wherein the tip of the gate pin is raised or elevated relative to the tips of the power pins so as to avoid electrical contact with the one of the spaced apart cooper plates, and wherein the tip of the gate pin is connected to a circuit of the battery management system (BMS).

The presently described subject matter is directed to a printed circuit board (PCB) device for use with a battery management system (BMS) of a lithium ion battery, comprising: a printed circuit board having spaced apart copper plates; and a plurality of MOSFETs bridging the copper plates, the MOSFETs each comprising: a semiconductor body; a plurality of power pins extending outwardly from at least one side of the semiconductor body, the power pins having tips bent downwardly and connected to one of the spaced apart copper plates; a gate pin extending outwardly from at least one side of the semiconductor body, the gate pin connected to a circuit of the battery management system (BMS), wherein the tip of the gate pin is raised or elevated relative to the tips of the power pins so as to avoid electrical contact with the one of the spaced apart cooper plates, and wherein the tip of the gate pin is connected to a circuit of the battery management system (BMS), wherein the gate pin is a straight gate pin.

The presently described subject matter is directed to a printed circuit board (PCB) device for use with a battery management system (BMS) of a lithium ion battery, comprising: a printed circuit board having spaced apart copper plates; and a plurality of MOSFETs bridging the copper plates, the MOSFETs each comprising: a semiconductor body; a plurality of power pins extending outwardly from at least one side of the semiconductor body, the power pins having tips bent downwardly and connected to one of the spaced apart copper plates; a gate pin extending outwardly from at least one side of the semiconductor body, the gate pin connected to a circuit of the battery management system (BMS), wherein the tip of the gate pin is raised or elevated relative to the tips of the power pins so as to avoid electrical contact with the one of the spaced apart cooper plates, and wherein the tip of the gate pin is connected to a circuit of the battery management system (BMS), wherein the gate pin is a partially bent gate pin.

The presently described subject matter is directed to a method of connecting a MOSFET to a printed circuit board (PCB) of a battery management system (BMS), the method comprising: locating a tip of a gate pin of the MOSFET at a raised or elevated position relative to tips of power pins of the MOSFET; installing the MOSFET bridging a pair of spaced apart copper plates located on a printed circuit board (PCB) of the battery management system (BMS) with the tips of the power pins connected to one of the spaced apart copper plates and a metal connector of the MOSFET connected to the other of the spaced apart copper plates; and electrically connecting the raised or elevated tip of the gate pin to a circuit of the battery management system (BMS).

The presently described subject matter is directed to a method of connecting a MOSFET to a printed circuit board (PCB) of a battery management system (BMS), the method comprising: locating a tip of a gate pin of the MOSFET at a raised or elevated position relative to tips of power pins of the MOSFET; installing the MOSFET bridging a pair of spaced apart copper plates located on a printed circuit board (PCB) of the battery management system (BMS) with the tips of the power pins connected to one of the spaced apart copper plates and a metal connector of the MOSFET connected to the other of the spaced apart copper plates; and electrically connecting the raised or elevated tip of the gate pin to a circuit of the battery management system (BMS), wherein the power pins of the MOSFET are bent, and the gate pin of the MOSFET is a straight gate pin with a raised or elevated tip.

The presently described subject matter is directed to a method of connecting a MOSFET to a printed circuit board (PCB) of a battery management system (BMS), the method comprising: locating a tip of a gate pin of the MOSFET at a raised or elevated position relative to tips of power pins of the MOSFET; installing the MOSFET bridging a pair of spaced apart copper plates located on a printed circuit board (PCB) of the battery management system (BMS) with the tips of the power pins connected to one of the spaced apart copper plates and a metal connector of the MOSFET connected to the other of the spaced apart copper plates; and electrically connecting the raised or elevated tip of the gate pin to a circuit of the battery management system (BMS), wherein the power pins of the MOSFET are bent, and the gate pin of the MOSFET is a partially bent gate pin with a raised or elevated tip.

The presently described subject matter is directed to a method of connecting a MOSFET to a printed circuit board (PCB) of a battery management system (BMS), the method comprising: locating a tip of a gate pin of the MOSFET at a raised or elevated position relative to tips of power pins of the MOSFET; installing the MOSFET bridging a pair of spaced apart copper plates located on a printed circuit board (PCB) of the battery management system (BMS) with the tips of the power pins connected to one of the spaced apart copper plates and a metal connector of the MOSFET connected to the other of the spaced apart copper plates; and electrically connecting the raised or elevated tip of the gate pin to a circuit of the battery management system (BMS), wherein the gate pin is electrically connected to the circuit of the battery management system (BMS) with a connecting wire.

The presently described subject matter is directed to a method of connecting a MOSFET to a printed circuit board (PCB) of a battery management system (BMS), the method comprising: locating a tip of a gate pin of the MOSFET at a raised or elevated position relative to tips of power pins of the MOSFET; installing the MOSFET bridging a pair of spaced apart copper plates located on a printed circuit board (PCB) of the battery management system (BMS) with the tips of the power pins connected to one of the spaced apart copper plates and a metal connector of the MOSFET connected to the other of the spaced apart copper plates; and electrically connecting the raised or elevated tip of the gate pin to a circuit of the battery management system (BMS), wherein the gate pin is electrically connected to the circuit of the battery management system (BMS) with a gate printed circuit board (PCB).

The presently described subject matter is directed to a method of connecting a MOSFET to a printed circuit board (PCB) of a battery management system (BMS), the method comprising: locating a tip of a gate pin of the MOSFET at a raised or elevated position relative to tips of power pins of the MOSFET; installing the MOSFET bridging a pair of spaced apart copper plates located on a printed circuit board (PCB) of the battery management system (BMS) with the tips of the power pins connected to one of the spaced apart copper plates and a metal connector of the MOSFET connected to the other of the spaced apart copper plates; and electrically connecting the raised or elevated tip of the gate pin to a circuit of the battery management system (BMS), wherein a connection of the gate pin with the circuit of the battery management system (BMS) is mechanically stabilized by providing a resilient material between the connection of the gate pin and the surface of the printed circuit board (PCB).

DETAILED DESCRIPTION

Figure 1:
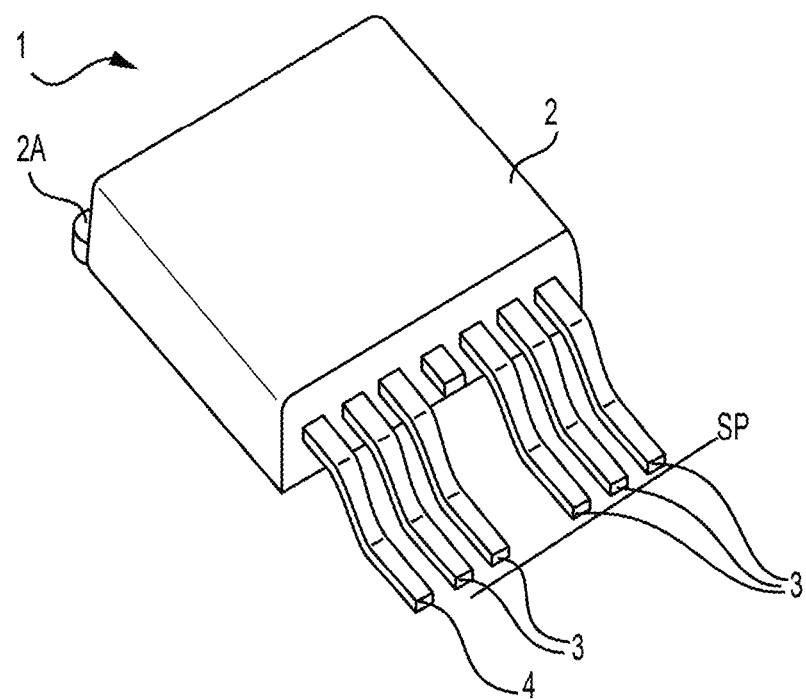
FIG. 1 is a perspective view of a conventional MOSFET having a standard configuration of the power pins and gate pin. Specifically, the tips of the power pins and gate pin are all located is a same plane and along a same axis in the same plane.
Figure 2:
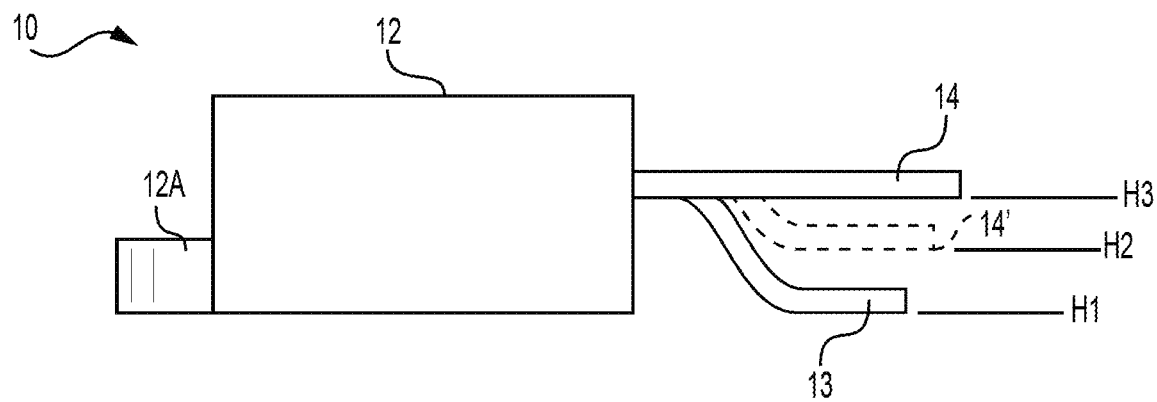
FIG. 2 is a perspective view of a semiconductor device (e.g. MOSFET) according to the present invention.
Figure 3:
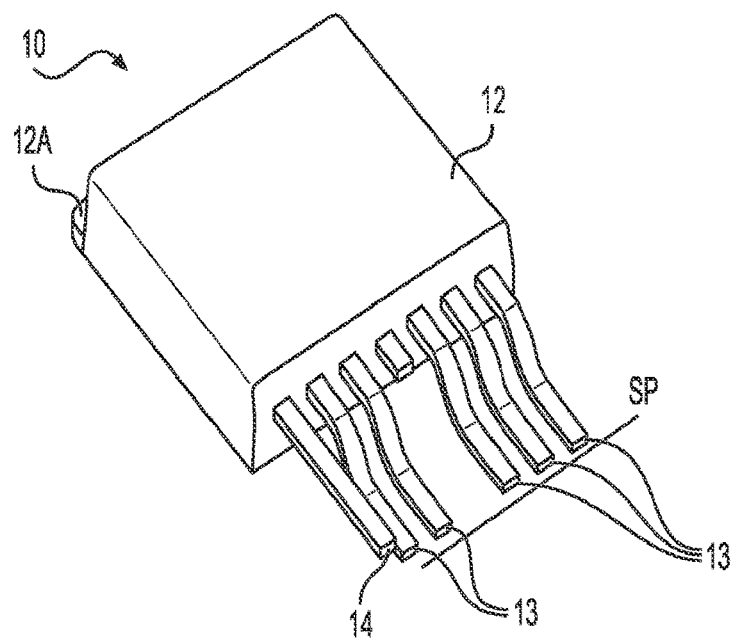
FIG. 3 is a side elevational view of the semiconductor device shown in FIG. 2.

A semiconductor device (e.g. MOSFET 10) according to the present invention is shown in FIGS. 2 and 3.

Figure 4:
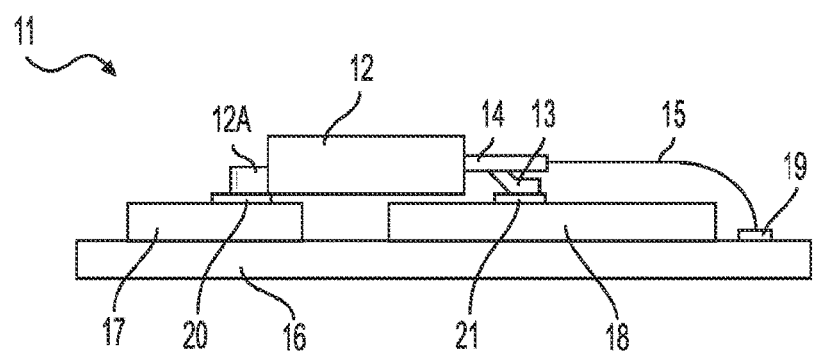
FIG. 4 is a side elevational view of the semiconductor device shown in FIGS. 2 and 3 installed onto a printed circuit board of a battery management system (BMS) for use in a lithium ion battery.

The MOSFET 10 comprises a body 12, a metal connector 12A, five (5) power pins 13, and one (1) gate pin 14. The power pins 13 and gate pin 14 extend outwardly from the side of the body 12. The gate pin 14, for example, is a straight gate pin 14, or a partially bent gate pin 14' (FIG. 2), and the power pins 13 are fully bent, as shown in FIG. 4.

It is pointed out that the tips of the power pins 13 are located at height H1, as shown in FIG. 2. The height of the tip of the partially bent gate pin 14' is at the height H2 (i.e. half height location), and the height of the tip of the straight gate pin 14 is at the height H3 (i.e. full height). Thus, the tip of the partially bent gate pin 14' and the tip of the straight gate pin 14 are elevated relative to the tips of the power pins 13 located at height H1. Thus, after the MOSFET 10 is installed, the tip of the partially bent gate pin 14' and the tip of the straight gate pin 14 are raised or elevated relative to the conductive plate 18 (FIG. 4) to avoid electrically contact therebetween.

As shown in FIGS. 2 and 3, the MOSFET 10 and copper plates 17, 18 are installed onto the printed circuit board (PCB) 16. Specifically, the copper plates 17, 18 are spaced apart, and then soldered onto anchors located on the printed circuit board (PCB) 16 (e.g. copper plates embedded into the surface or thickness or through the printed circuit board (PCB) 16). The MOSFET 10 is then soldered onto the spaced apart copper plates 17, 18. Specifically, the metal connector 12A of the MOSFET 10 is soldered (e.g. via soldered layer 20) onto the copper plate 17, and the tips of the power pins 13 of the MOSFET 10 are soldered (e.g. via soldered layer 21) onto the copper plate 18. Further, one end of a wire connector 15 is soldered to the gate pin 14, and an opposite end of the wire connector 15 is soldered (e.g. via soldered layer 19) onto a particular trace of the printed circuit board (PCB) 16.

Figure 5:
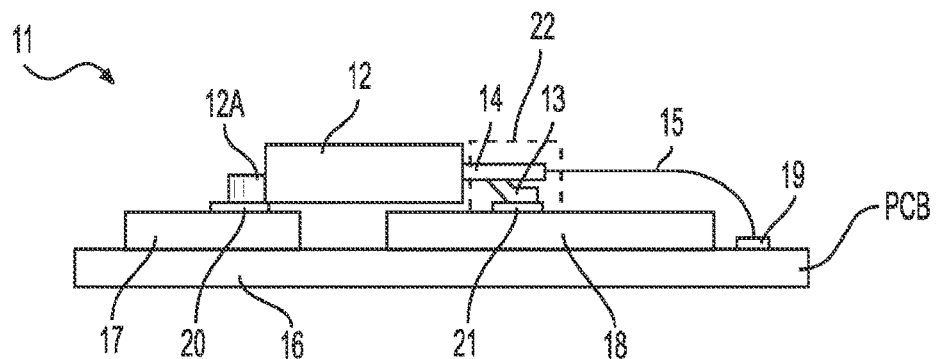
FIG. 5 is a side elevational view of the semiconductor device shown in FIG. 4 installed onto a printed circuit board of a battery management system (BMS) for use in a lithium ion battery showing the connector wire protected.

As shown in FIG. 5, a material 22 (e.g. Room Temperature Vulcanizing (RTV) Silicone) is applied at least between the gate pin 14 and the upper surface of the printed circuit board (PCB) 16 to stabilize and support the gate pin 14 and wire connector 15 against vibration and/or physical shock to prevent breakage of the soldered connection between the gate pin 14 and wire connector 15. For example, the material 22 is applied by a caulk gun.

Figure 6:
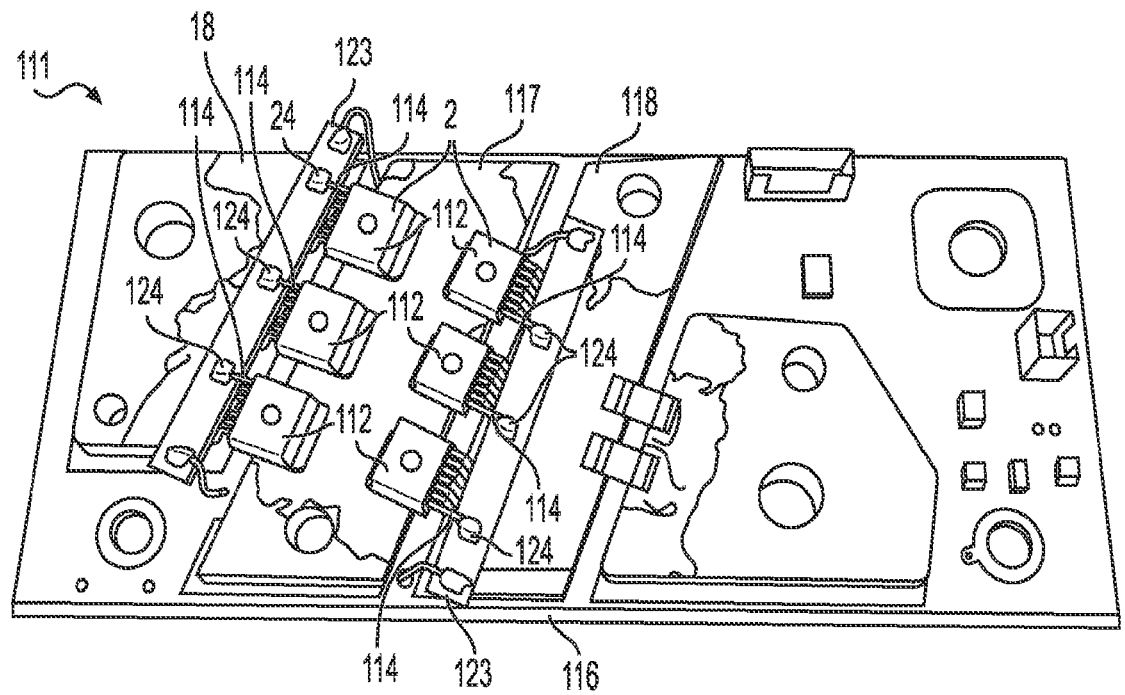
FIG. 6 is a perspective view of the printed circuit board (PCB) of the battery management system (BMS) showing multiple semiconductor devices shown in FIGS. 2 and 3 installed onto the printed circuit board (PCB) of a battery management system (BMS) for use in a lithium ion battery.
Figure 7:
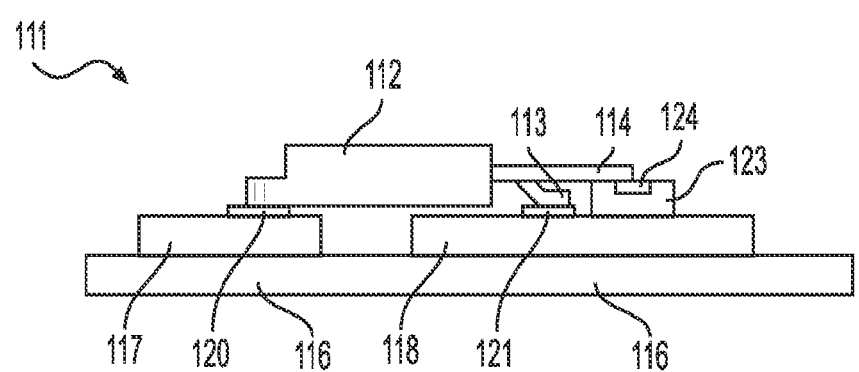
FIG. 7 is a side elevational view of the semiconductor device shown in FIG. 2 installed in an alternative manner onto a printed circuit board of a battery management system (BMS) for use in a lithium ion battery.

Another arrangement for installing one or more MOFETs 112 onto a printed circuit board (PCB) 116 according to the present invention is shown in FIGS. 6 and 7. A plurality of MOFETs 112 (e.g. six (6) shown) are installed by soldering onto the spaced apart copper plates 118, 117. The tips of the power pins 113 are soldered onto the respective copper plates 118. The tips of the gate pins 114 are soldered onto respective gate printed circuit boards 123 connected to the copper plates 118, 117 (e.g. by soldering). Specifically, the gate printed circuit boards 123 are provided with a plurality of soldering tabs or soldering areas 124, which are soldered to the respective tips of the straight gate pins 114.

The gate printed circuit boards 123 act as insulating spacers located between the copper plates 118, 118 and the tips of the gate pins 124. The gate printed circuit boards have a conductive trace or a conductive layer that can be connected (e.g. soldered) to other circuits or components of the printed circuit board 116 (e.g. via wire or conductive lead(s)).

The gate printed circuit boards 123 occupy the space located between the copper plates 118 and the tips of the gate pins 114 of the MOSFETs 112, and insulate the tips of the gate pins 114 of the MOSFETs 112 from the copper plates 118.

The invention claimed is:

1. A MOSFET device for use with a printed circuit board (PCB), the device comprising:
    a semiconductor body;
    a metal conductor extending outwardly from a side of the semiconductor body;
    a plurality of power pins extending outwardly from at least one side of the semiconductor body, the power pins having tips bent downwardly and electrically connected to one or more spaced apart copper plates;
    a gate pin extending outwardly from at least one side of the semiconductor body,
    wherein the tip of the gate pin is elevated relative to the tips of the power pins so as to avoid electrical contact with the one or more spaced apart copper plates, and
    wherein the tip of the gate pin is connected to one of a plurality of soldering tabs or soldering areas on a gate printed circuit board, the gate printed circuit board elevated relative to the spaced apart copper plates.

2. The device according to claim 1, wherein the gate pin is a straight gate pin.

3. The device according to claim 1, wherein the power pins have a fully bent configuration and the gate pin has a partially bent configuration.

4. The device according to claim 1, wherein a lower surface of the tips of the power pins are located in a same plane as a lower surface of the semiconductor body.

5. The device according to claim 1, wherein the gate printed circuit board insulates the tip of the gate pin from the spaced apart copper plates.

6. A printed circuit board (PCB) device, comprising;
    a printed circuit board having spaced apart copper plates; and
    a plurality of MOSFETs bridging the copper plates, the MOSFETs each comprising:
    a semiconductor body;
    a plurality of power pins extending outwardly from at least one side of the semiconductor body, the power pins having tips bent downwardly and connected to one of the spaced apart copper plates;

a gate pin extending outwardly from at least one side of the semiconductor body, wherein the tip of the gate pin is elevated relative to the tips of the power pins so as to avoid electrical contact with the one of the spaced apart cooper plates, and wherein the tip of the gate pin is connected to a first end of a wire connector, the wire connector elevated relative to the spaced apart copper plates, wherein a second end of the wire connector is connected to a trace of the PCB.

7. The device according to claim 6, wherein the gate pin is a straight gate pin.

8. The device according to claim 6, wherein the gate pin is a partially bent gate pin.

9. A method of connecting a MOSFET to a printed circuit board (PCB), the method comprising:

locating a tip of a gate pin of the MOSFET at an elevated position relative to tips of power pins of the MOSFET;

installing the MOSFET bridging a pair of spaced apart copper plates located on the printed circuit board (PCB) with the tips of the power pins connected to one of the spaced apart copper plates and a metal connector of the MOSFET connected to the other of the spaced apart copper plates;

electrically connecting the elevated tip of the gate pin to a first end of a connector wire or a gate printed circuit board, the first end of the connector wire or the gate printed circuit board elevated relative to the spaced apart copper plates; and providing a resilient material between the connection of the gate pin and a surface of the PCB, the resilient material mechanically stabilizing the gate pin.

10. The method according to claim 9, wherein the power pins of the MOSFET are bent, and the gate pin of the MOSFET is a straight gate pin with an elevated tip.

11. The method according to claim 9, wherein the power pins of the MOSFET are bent, and the gate pin of the MOSFET is a partially bent gate pin with an elevated tip.

* * * * *